Jan. 4, 1966 J. W. GRAY 3,227,895

SIGNAL DIFFERENTIAL COMPARATOR AMPLIFIER

Filed April 2, 1963

INVENTOR.
JOHN W. GRAY

BY H. S. Mackey

ATTORNEY.

United States Patent Office 3,227,895
Patented Jan. 4, 1966

3,227,895

SIGNAL DIFFERENTIAL COMPARATOR AMPLIFIER

John W. Gray, Pleasantville, N.Y., assignor to General Precision, Inc., a corporation of Delaware Filed Apr. 2, 1963, Ser. No. 270,038
8 Claims. (Cl. 307—88.5)

This invention relates generally to voltage amplifiers and particularly to amplifiers which determine when an unknown potential exceeds a reference potential.

A comparator amplifier in general compares an unknown potential with a reference potential such as ground and delivers an output indicating whether the unknown potential is above the reference potential. Such amplifiers are useful for many purposes, one example being in connection with computing circuits. A comparator amplifier should have a high input impedance so that the input circuits are not loaded unduly. It is especially important that the amplifier draw nearly zero input current when the input voltage is near zero. The amplifier should also have very high gain, so that a very small input voltage produces an output sufficient to control other components of the system.

When used in connection with digital computers, the above stringent design requirements are compensated for to some extent by the conditions of operation which permit certain expedients to be used which are unavailable in the case of an ordinary amplifier. For example, the comparator amplifier is usually operated only when called upon by a suitable clock pulse or enabling gate. Thus it is possible to perform certain stabilizing or calibration functions during periods of inoperativeness. As another example, the output voltage range required is limited. Any input voltage in excess of a predetermined minimum may produce the same output, because the amplifier is required only to determine the presence of a difference between the input and the reference, not the magnitude of the difference.

In the past various kinds of comparator amplifiers have been used such as stabilized direct coupled amplifiers or alternating current amplifiers in which both input and output are clamped to the reference potential in the interval between successive digital representations. Both of these kinds of comparator amplifiers are limited in speed of response by the time required to operate switches. Switching transistors are available but even these are not always fast enough when it is realized that during the interval between clock pulses not only must the comparator amplifier operate but sufficient time must be allowed for the output of the amplifier to operate additional switches associated with other components of the system.

It is a general object of the present invention to provide an improved comparator amplifier.

Another object is to provide a comparator amplifier having a high input impedance.

Another object is to provide a comparator amplifier capable of acting quickly so that a rapid series of input voltages may be compared with a reference successively.

Another object is to provide a high gain comparator amplifier.

Another object is to provide a comparator amplifier capable of comparing an input potential with a reference potential more quickly and more accurately than has heretofore been possible.

Briefly stated, in a preferred embodiment of the invention, the input potential is compared with ground potential during an enabling gate. The input circuit is capacitively coupled to the base of a transistor connected as an emitter follower to provide a high input impedance and low output impedance. The input impedance is further raised by "bootstrapping" the emitter to the input. The emitter is also connected to one plate of a large capacitor, the second plate of which is connected to succeeding stages. The input circuit and the second plate are normally clamped to ground by transistor switches but are released during the enabling gate, whereupon the second plate follows precisely the variations of the input potential. The emitter follower provides a low source impedance and the capacitor is large enough so that the voltage between its plates does not change appreciably during the entire gate. The succeeding stages amplify the voltage at the second plate sufficiently to operate other equipment. Several input voltages (nine in one embodiment) can be compared with ground successively during the gate without requiring switching between comparisons.

For a clearer understanding of the invention, reference may be made to the following detailed description and the accompanying drawing, in which.

Figure 1:
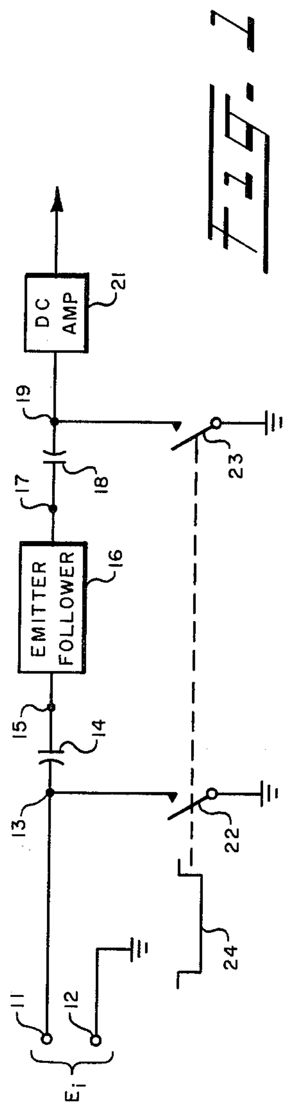
FIGURE 1 is a simplified schematic diagram of the invention.

Referring first to FIGURE 1, the input potential, $E_1$, which is to be compared with a reference potential such as ground, is connected between terminals 11 and 12, the former being connected to the junction 13 and the latter to ground. The junction 13 is coupled by a capacitor 14 to a junction 15 which in turn is connected to the input of a transistor emitter follower circuit 16, the output of which appears at the junction 17. The latter junction is coupled by a capacitor 18 to a junction 19 which in turn is connected to the input of a direct coupled amplifier 21. Two switches 22 and 23 are connected between the junctions 13 and 19, respectively, and ground. These switches are normally closed, grounding the junctions, but are opened during and only during the presence of an enabling gate 24.

Before the arrival of the gate 24, the switches 22 and 23 are closed, clamping the junctions 13 and 19 to ground potential. The junctions 15 and 17 are free to assume any potential required by the operation of the emitter follower circuit 16. When the gate 24 arrives, the switches are opened and the junction 13 assumes the potential $E_1$ of the input. Any difference between the potential $E_1$ and ground is passed through the capacitor 14 to the junction 15, the potential of which changes by the amount $E_1$. The potential of the junction 17 changes by a like amount and this change is passed through the capacitor 18 to the junction 19. The latter junction therefore has impressed upon it a potential nearly equal to that of $E_1$, reduced but slightly because the emitter follower circuit has a gain less than unity. However, the junction 19 is the output of an emitter follower which is a low impedance source capable of driving the amplifier 21 while the junction 15 presents a high impedance which does not load the input circuit appreciably. The capacitors 14 and 18 are large enough so that although a small current is drawn from each to operate the emitter follower 16 and the amplifier 21 respectively, the voltage across each does not change appreciably during the entire gate. The amplifier 21 has sufficient gain to yield an appreciable output from a very small input. A voltage appearing at the terminals 11 and 12 at any time during the gate thus produces an appreciable output. The gate may be on the order of 50 $\mu$sec. duration so that many voltage comparisons can be made without the necessity of operating switches between comparisons.

Figure 2:
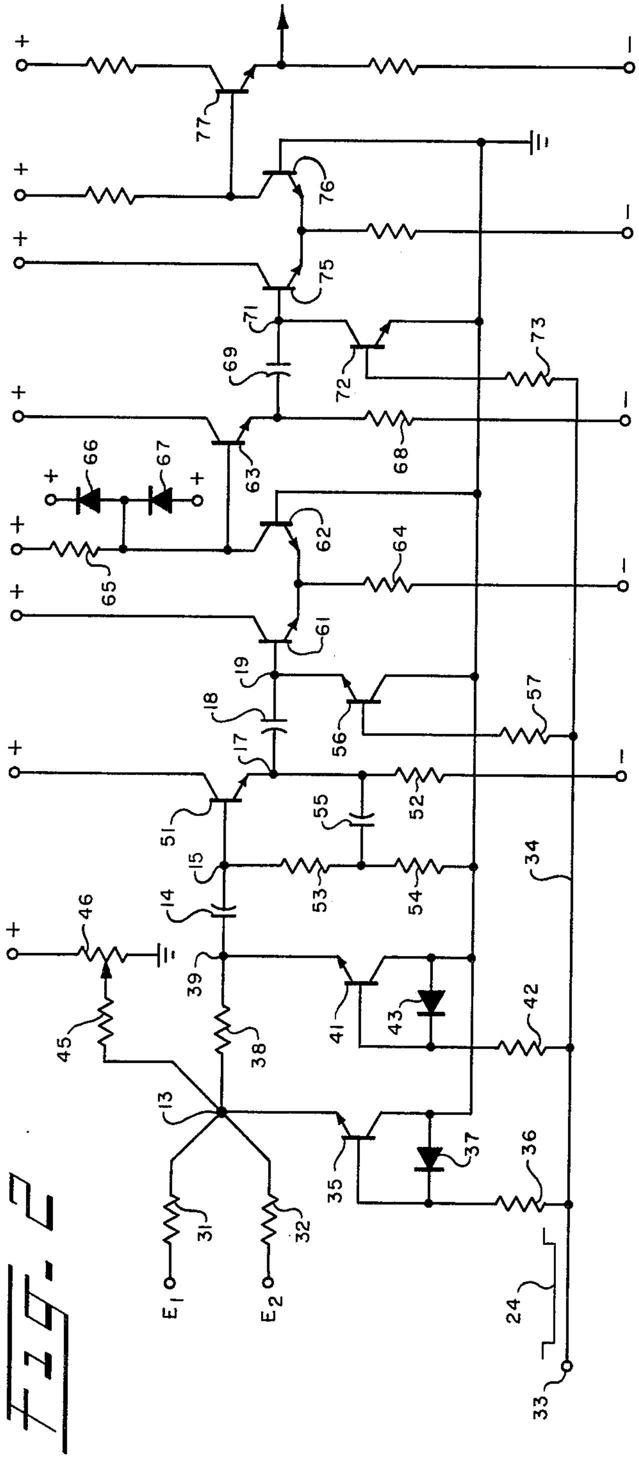
FIGURE 2 is a schematic diagram of a preferred embodiment of the invention.

Referring now to FIGURE 2, there is shown the junction or summing point 13 the potential of which is to be compared with ground potential. By way of illustrating one use for the comparator amplifier, there is shown one kind of input circuit frequently used. A source of positive voltage $E_1$ is connected through a resistor 31 to the junction 13 and a source of negative voltage $E_2$ is connected to the junction 13 through a resistor 32. When the voltages and resistors are properly selected, that is, when $E_1/R31=E_2/R32$, the potential of the summing point 13 will be zero. When $E_1$ is too high or resistor 31 too small, the potential of the junction 13 rises, causing the comparator amplifier to yield an output which can be applied to a feedback arrangement to adjust either $E_1$ or resistor 31. The present invention is not concerned with such feedback arrangements but solely with the comparator amplifier which is required to generate a substantial output when the potential of the junction 13 rises above ground.

The enabling gate 24 is applied to a terminal 33 which is connected to a bus 34 for application to the various transistor switches. The junction 13 is grounded, in the absence of the gate 24, by a transistor 35 the emitter of which is connected to the junction 13, the collector of which is grounded, and the base of which is connected through a resistor 36 to the bus 34. A diode 37 connected between the collector and the base prevents excessive voltage rise.

In the absence of the gate 24, the transistor 35 is conductive, thereby ostensibly grounding the junction 13. However, it is to be noted that at times the voltages $E_1$ and $E_2$ may be such as to cause an appreciable current to flow through the transistor 35. The effective resistance of the emitter-collector circuit of the transistor 35 is not zero but may be on the order of 20 ohms or so. Accordingly, the potential of the junction 13 may be 10 or more millivolts above ground. Since the comparator amplifier is required to respond to potentials of about one millivolt above ground, it is necessary to reduce the input potential further.

The junction 13 is connected through a resistor 38, which may have a value of about 1,000 ohms, to a junction 39. The latter junction is connected to the emitter of a transistor 41, the collector of which is grounded and the base of which is connected through a resistor 42 to the gate bus 34. A diode 43 connected between the base and collector prevents excessive voltage rise. The resistor 38 and the transistor 41 constitute a voltage divider between the junction 13 and ground, and since the effective resistance of the transistor 41 is only about 20 ohms, the potential of the junction 39 is reduced to about 2% of that of the junction 13.

Final zero adjusting is obtained by supplying a very small auxiliary current to the summing point 13. A large resistor 45, on the order of several megohms, is connected between the junction 13 and the wiper of a potentiometer 46 which is connected between a positive source and ground.

The junction 39 is coupled by the capacitor 14 to the junction 15 which is the input to the emitter follower circuit. The junction 15 is connected to the base of a transistor 51 the collector of which is connected to a source of positive voltage and the emitter of which is connected to the junction 17 and through a resistor 52 to a negative source. Resistors 53 and 54 are serially connected between the junction 15 and ground. A capacitor 55 couples the junction 17 to the junction of the resistors 53 and 54. This sort of connection is sometimes called "bootstrapping" and increases the input impedance. The junction 17 is coupled by the capacitor 18 to the junction 19. A switching transistor 56 has its emitter connected to the junction 19, its collector connected to ground, and its base connected through a resistor 57 to the enabling gate bus 34. The direct-coupled amplifier indicated in FIGURE 1 by the block 21 comprises transistors 61, 62 and 63. The junction 19 is connected to the base of the transistor 61.

The apparatus so far described operates as previously explained in connection with FIGURE 1. Before the arrival of the gate 24, the transistors 35, 41 and 56 substantially ground the junctions 13, 39 and 19. The junctions 15 and 17 assume any potential dictated by the operation of the transistor 51 and the capacitors 14 and 18 are charged. When the gate 24 arrives, the transistors 35, 41 and 56 are rendered nonconductive, allowing the junctions 13 and 39 to assume the potential dictated by the input circuits. Any change from ground potential is passed by the capacitor 14 to the junction 15 and thence through the emitter follower transistor 51 to the junction 17 and through the capacitor 18 to the junction 19. The potential of the latter junction is substantially that of the input, being reduced slightly by the small loss through the emitter follower. However, the junction 19 is a low impedance source while the junction 13 is a high impedance summing point.

The capacitors 14 and 18 are quite large, about 10 $\mu$f. each, to insure that the voltage across each does not change appreciably during the gate 24. The current demands are small because, as previously mentioned, the transistor 51 is a bootstrapped emitter follower having a very high input impedance, and because, as will appear, the transistor 61 is also an emitter follower having inherently high input impedance. The gate 24 may be on the order of 50 $\mu$sec. long so that a number of voltages sequentially applied to the junction 13 may be compared with ground without requiring switching operations between comparisons.

The transistors 61 and 62 are connected as a differential amplifier in which the transistor 61 is an emitter follower which drives the emitter of the transistor 62. More specifically, the collector of the transistor 61 is connected to a source of positive voltage. The emitters of the transistors 61 and 62 are connected together and through a resistor 64 to a source of negative potential. The base of the transistor 62 is grounded while the collector is connected through a resistor 65 to a positive voltage source. Since at times the input voltage may be several volts, it is desirable to limit the excursion of the potential of the collector of the transistor 62 in order to prevent overloading of succeeding elements. Accordingly the collector is connected to the anode of a diode 66 the cathode of which is connected to a positive source on the order of eight volts to limit the rise in collector potential. A lower limit is set by connecting the collector to the cathode of a diode 67 the anode of which is connected to a positive source on the order of two volts. The collector of the transistor 62 is also connected to the base of the emitter follower transistor 63, the collector of which is connected to a positive source and the emitter of which is connected through a resistor 68 to a negative source.

The differential amplifier plus emitter follower connection of the transistors 61, 62 and 63 not only provides a high input impedance and a low output impedance but additionally insures that the output voltage will drift but very little because the temperature effects of the transistors 61 and 62 tend to cancel each other. In operation of this portion of the circuit, voltage changes at the junction 19 appear in amplified form at the emitter of the transistor 63. Further amplification can be obtained by a circuit substantially repeating that of the transistors 61, 62 and 63. The emitter of the transistor 63 is coupled by another large capacitor 69 to a junction 71 which is normally grounded by a switching transistor 72. The latter transistor has its collector, instead of its emitter, connected to the junction 71 and its emitter grounded. The base is conneced through a resistor 73 to the bus 34 so as to render the transistor 72 nonconductive during the gate. The grounded emitter connection is used here instead of the grounded collector configuration of the transistors 35 and 41 because the former, although producing a slightly larger voltage drop, can withstand a greater applied voltage. At this point in the circuit the larger voltage drop is of no consequence.

As before, the junction 71 is at substantially ground potential before the arrival of the gate and then has impressed thereon an amplified version of the input voltage. The latter voltage is further amplified by the transistors 75 and 76 connected as a differential amplifier and the output is taken from the emitter follower transistor 77.

In the specific embodiment of the invention illustrated, inputs at ground potential or below are not required to and do not produce any significant change in output voltage. However, input potentials as little as a millivolt above ground generate an output voltage of about ten volts which is more than sufficient to operate other equipment. An important characteristic of the invention is that no switching occurs during the gate and accordingly many successive voltage comparisons may be made quickly. In one application of the present embodiment, nine successive voltage comparisons are made during the 50 μsec. gate. Since each comparison is made quickly, there is ample time available for operation of other equipment in response to each comparison before the next comparison is made.

Although a specific embodiment of the invention has been described in considerable detail for illustrative purposes, many modifications will occur to those skilled in the art. It is therefore desired that the protection afforded by Letters Patent be limited only by the true scope of the appended claims.

What is claimed is:

1. Apparatus for comparing an unknown potential with a reference potential, comprising,
- a first junction to which the unknown potential is applied,
- a second junction,
- a resistor interconnecting said first and second junctions,
- a transistor including a collector, an emitter and a base connected as an emitter follower,
- a first capacitor for coupling said second junction to said base and for isolating said base from said second junction when said second junction is at said reference potential,
- a third junction,
- a second capacitor for coupling said emitter to said third junction and for isolating said base from said third junction when said third junction is at said reference potential,
- a source of a signal the duration of which defines a period of operation of said apparatus, and
- transistor switch means controlled by said signal for applying said reference potential to all three of said junctions except during the occurrence of said signal.

2. An amplifier for successively comparing a sequentially occurring series of potentials with a reference potential, comprising,
- a plurality of parallel input means for applying said series of potentials to a first junction,
- a source providing an enabling gate having a duration longer than the duration of all of said sequentially occurring potentials,
- a transistor emitter follower circuit having an input and an output,
- a first capacitor for coupling said first junction to said input of said emitter follower circuit,
- a second junction,
- a second capacitor for coupling said output of said emitter follower to said second junction,
- an amplifier having its input connected to said second junction, and
- switch means operated by said gate for connecting said first and second junctions to said reference potential in the absence of said gate and for electrically isolating said emitter follower circuit from said first and second junctions and for disconnecting said junctions during the presence of said gate for electrically unisolating said emitter follower circuit.

3. An amplifier for successively comparing a sequentially occurring series of potentials with a reference potential, comprising,
- a first junction to which said series of potentials is applied,
- a second junction,
- a resistor interconnecting said first and second junctions,
- a transistor emitter follower circuit having an input and an output,
- a first capacitor connecting said second junction to said input of said emitter follower circuit for electrically isolating said input from said second junction when said second junction is at said reference potential,
- a third junction,
- a second capacitor connecting said output of said emitter follower to said third junction for electrically isolating said output from said third junction when said third junction is at said reference potential,
- an amplifier having its input connected to said third junction,
- a source providing an enabling gate having a duration longer than the duration of all of said sequentially occurring potentials, and
- means controlled by said enabling gate for connecting all of said junctions to said reference potential in the absence of said gate and for disconnecting said junctions from said reference potential during the presence of said gate.

4. An amplifier for successively comparing a sequentially occurring series of potentials with a reference potential, comprising,
- a first source of reference potential,
- a first junction to which said series of potentials is applied,
- a first transistor connected as an emitter follower circuit having an input and an output,
- a first capacitor for coupling said first junction to said input of said emitter follower circuit,
- a second junction,
- a second capacitor for coupling said output of said emitter follower circuit to said second junction,
- a resistance-capacitance series circuit connected between said output and input of said transistor emitter follower for charging said first capacitor when said first junction is at reference potential,
- an amplifier having its input connected to said second junction,
- second and third transistors each having a collector, an emitter and a base,
- the collector-emitter circuits of said second and third transistors being connected between said first source and said first and second junctions respectively,
- a second source for providing a signal having a duration longer than the duration of all of said sequentially occurring potentials, and
- means for applying a potential derived from said signal to the bases of said second and third transistors for rendering said transistors nonconductive,
- whereby said second and third transistors are conductive in the absence of said signal and nonconductive in the presence of said signal.

5. An amplifier for successively comparing a sequentially occurring series of potentials with a reference potential, comprising,
- a first junction to which said series of potentials is applied,
- a second junction,
- a first resistor interconnecting said first and second junctions,
- a transistor having a collector, an emitter, and a base,
- a second resistor connecting said emitter to a second voltage source,
- third and fourth serially connected resistors connecting said base to a third voltage source of potential intermediate between that of said first and second voltage sources,
- a first capacitor for coupling said second junction to said base, a second capacitor coupling said emitter to a third junction which is the junction of said third and fourth resistors,
a fourth junction,
a third-capacitor coupling said emitter to said fourth junction,
a source providing a signal having a duration longer than the duration of all of said sequentially occurring potentials, and
means controlled by said signal for applying said reference potential to said first, second and foutrh junctions except during the occurrence of said signal.

6. Apparatus for comparing an unknown potential with a reference potential comprising,
a first junction to which the unknown potential is applied,
a bootstrapped impedance transforming circuit having an input and an output terminal,
means for coupling said first junction to said input terminal and for isolating said input terminal from said first junction when said first junction is at said reference potential,
a second junction,
means for coupling said second junction to said output terminal and for isolating said output terminal from said second junction when said junction is at said reference potential,
a source of a signal the duration of which identifies a period of operation of said apparatus, and
means controlled by said signal for applying said reference potential to said first and second junctions except during the occurrence of said signal.

7. Apparatus for comparing an unknown potential with a reference potential comprising,
a first junction to which the unknown potential is applied,
a second junction,
a resistor interconnecting said first and second junctions,
a transistor having a collector, an emitter and a base, connected as an emitter follower,
a capacitor connected between said second junction and said base for essentially isolating said base from said second junction when said second junction is essentially at said reference potential,
a potential divider connected between said base and said reference potential,
a capacitor coupling said emitter to an interim point on said potential divider for bootstrapping said transistor emitter follower, a third junction,
a third capacitor connected between said third junction and said emitter for essentially isolating said emitter from said third junction when said third junction is at said reference potential,
a source of a signal the duration of which defines a period of operation of said apparatus, and
switch means controlled by said signal for applying said reference potential to said first, second and third junctions except during the occurrence of said signal.

8. An amplifier for comparing an unknown potential with a reference potential during an enabling gate, comprising,
a first junction to which the unknown potential is connected,
a transistor connected as an emitter follower,
a second junction on the output side of said transistor,
a first capacitor and a second capacitor,
said first capacitor connected between said first junction and the input of said transistor emitter follower and said second capacitor connected between said second junction and the output of said transistor emitter follower for isolating said transistor from said first and second junctions when both said junctions are at reference potential,
an amplifier having its input connected to said second junction, and
switch means for connecting said first junction to said reference potential,
second switch means for connecting said second junction ot said reference potential,
gate means for providing parallel operation of said switch means and said second switch means for removing said reference potential during presence of a gating signal.

References Cited by the Examiner

UNITED STATES PATENTS

| | | | |
|---|---|---|---|
| 2,757,283 | 7/1956 | Ingerson et al. | 328—147 |
| 2,995,712 | 8/1961 | Montgomery | 330—32 X |
| 3,061,671 | 10/1962 | Waller | 307—88.5 |
| 3,095,511 | 6/1963 | Maestre | 307—88.5 |
| 3,102,924 | 9/1963 | Legler | 330—32 |
| 3,157,873 | 11/1964 | Slack | 307—88.5 |

ARTHUR GAUSS, *Primary Examiner.*

JOHN W. HUCKERT, *Examiner.*